United States Patent [19]

Hayes et al.

[11] Patent Number: 5,777,846
[45] Date of Patent: Jul. 7, 1998

[54] CIRCUIT PACKS AND CIRCUIT PACK AND SHELF ASSEMBLIES

[75] Inventors: Hasler R. Hayes, Munster; Michael H. Daniels, Kanata; John C. Atkinson, Ottawa, all of Canada

[73] Assignee: Northern Telecom Limited, Montreal, Canada

[21] Appl. No.: 655,401

[22] Filed: May 30, 1996

[51] Int. Cl.⁶ .................................................. H05K 7/20
[52] U.S. Cl. .................................................. 361/690
[58] Field of Search .............................. 361/688, 690–695, 361/705, 714–720, 730, 736, 752

[56] References Cited

U.S. PATENT DOCUMENTS

| | | | |
|---|---|---|---|
| 3,940,665 | 2/1976 | Seki | 361/688 |
| 4,644,443 | 2/1987 | Swensen et al. | 361/688 |
| 4,894,749 | 1/1990 | Elko et al. | 361/690 |
| 5,410,448 | 4/1995 | Barker, III et al. | 361/695 |
| 5,607,538 | 3/1997 | Cooke | 361/719 |

FOREIGN PATENT DOCUMENTS

| | | | |
|---|---|---|---|
| 4157798 | 5/1992 | Japan | 361/716 |
| 1413735 | 7/1988 | U.S.S.R. | 361/688 |

*Primary Examiner*—Gregory D. Thompson
*Attorney, Agent, or Firm*—R.J. Austin

[57] ABSTRACT

Circuit pack wherein the electronic components are arranged with high temperature operating components on one side of a PCB and low temperature components on the other side. The PCB acts as a thermal insulator to restrict heat flow from the hot to cooler components. The components on each side of the board are disposed in a vertical connection chimney for heat removal.

9 Claims, 2 Drawing Sheets

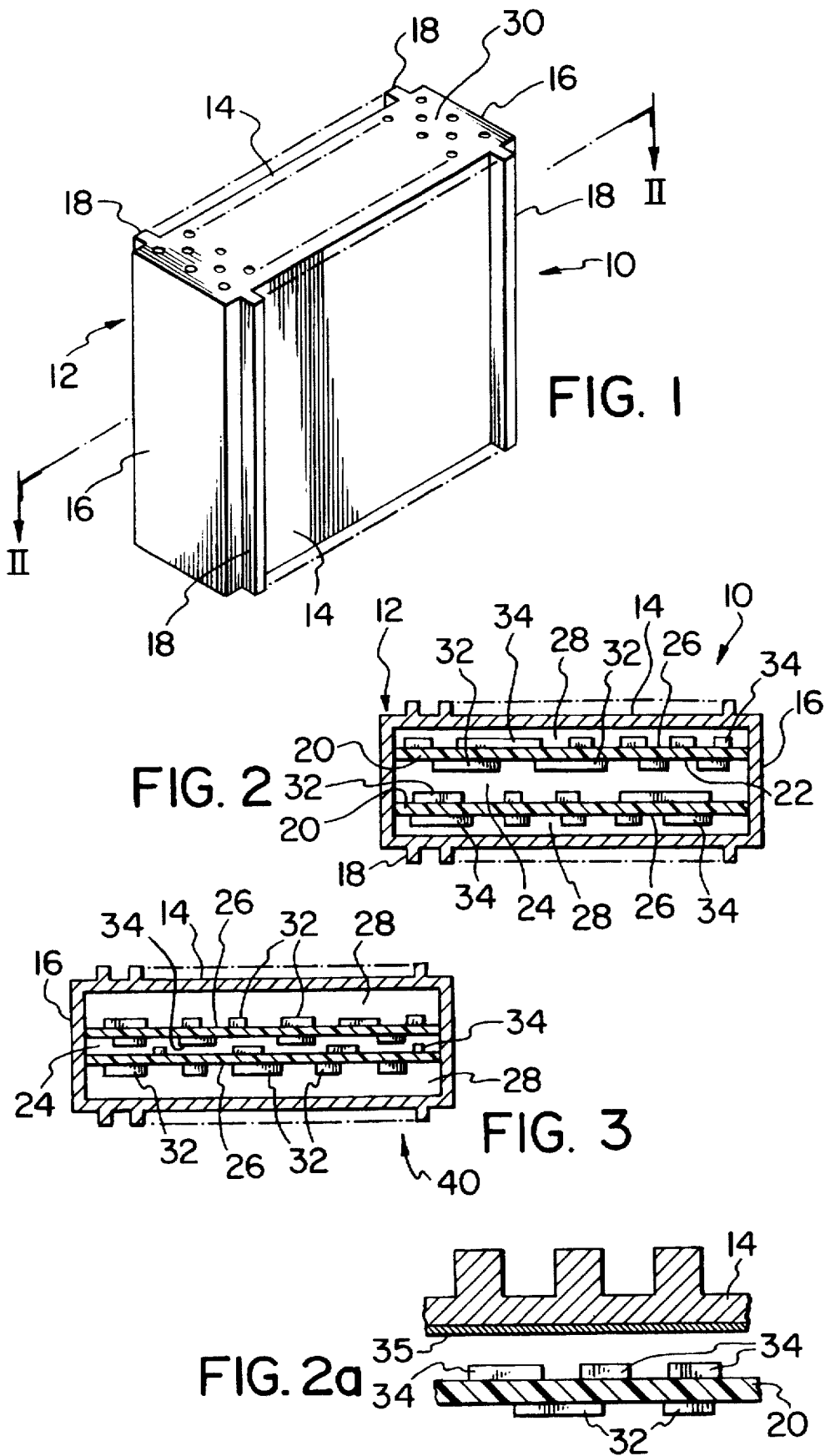

5,777,846

CIRCUIT PACKS AND CIRCUIT PACK AND SHELF ASSEMBLIES

This invention relates to circuit packs and shelf and circuit pack assemblies.

In conventional methods of packaging electronic components elements in a shelf the electronic components are positioned on printed circuit boards which are disposed in vertical planes in spaced horizontal relationship so as to provide vertical spaces or chimneys through which cooling air passes upwardly either strictly by natural convection or under enforced pressure.

Of the multiplicity of electronic components which at present are known, many operate at high temperatures while others operate at relatively lower temperatures. The cooling air is intended to prevent any component from becoming heated to a temperature above its required operational temperature, because of the danger of the component becoming inoperative. A further problem is that the high temperature generating and operating components tend to transfer their heat to the lower temperature operating components which may not be able to withstand the heat to which they are being subjected. Thus, safeguards need to be taken to minimize this problem. For instance, in U.S. Pat. No. 5,467,251 granted Nov. 14, 1995 to R. Katchmar, in a printed circuit board arrangement, a heat conductive member extends over the whole board area to conduct heat throughout the board thereby removing hot spots from local areas. Bridge members are provided which remove the heat from the heat conductive member and transfer it to a heat sink. In another patent application Ser. No. 08/601,671 to R. Katchmar and filed Feb. 15, 1996 as a Continuation-In-Part of an originating application dated Jan. 26, 1995, and now U.S. Pat. 5,646,826 which issued on Jul. 8, 1997, heat conductive members are provided preferably directly between the electronic components and a heat sink by causing a flowable material for making the heat conductive members to flow and occupy a space between the electronic components and the heat sink. Upon solidification, the flowable material provides the heat conductive members which transmit the heat directly from the electronic components to the heat sink thereby bypassing the printed circuit board.

The present invention seeks to provide a circuit pack and also a shelf and printed circuit pack arrangement in which temperature control of components is achieved in a different manner.

According to one aspect, the invention provides a circuit board arrangement comprising a printed circuit board, high temperature operational electronic components providing a first group of components and relatively low temperature operating electronic components providing a second group of components with one of the first and second groups mounted at one side of the printed circuit board and the other of the first and second groups mounted at the other side of the printed circuit board with the printed circuit board acting as a thermal insulator between the two groups.

With the above arrangement according to the invention, transfer of heat from the high to the low temperature operating components is minimized thereby minimizing the problems of inoperativeness of the low temperature operating components because of heat build-up.

According to a further aspect, the invention provides a circuit pack comprising two printed circuit boards having spaced apart and confronting main surfaces within a housing and with the opposite main board surfaces facing and spaced from walls of the housing to provide air flow passages on both sides of each board, the passages having openings at each end of the housing, and high temperature operational electronic components providing a first group of components and relatively low temperature operating electronic components providing a second group of components with one of the first and second groups being located in the space between the boards and the other of the groups being disposed within at least one space between a board and a wall of the housing.

In one arrangement, the high temperature operational components are located in a space between a board and its opposing housing wall whereas the low temperature operational components are located in the space between the boards. Alternatively, the high temperature operational components are disposed between the boards and the low temperature operational components are located in a space between a board and its opposing housing wall. In either case, the printed circuit boards provide a heat insulation to resist heat flow from side-to-side of the board. Hence, the heat present in any of the passages is created generally by the heat of operation of the electronic components lying in that passage and requires to be removed from within that passage and away from the circuit pack. The distances between boards and the distances between boards and housing walls are predetermined to provide the required thermal drag over the two groups of components and for balancing the thermal drag with the thermal isolation provided by the printed circuit boards themselves. If is, of course, an assistance in heat removal if the housing of the circuit pack is provided by highly heat conductive material and fins may be provided upon the exterior of the housing to provide a heat sink with the fins lying in a further vertical passage disposed outside the circuit pack itself.

According to a further aspect of the invention there is provided a shelf and printed circuit board arrangement comprising a shelf, a plurality of circuit boards, the shelf having receiving stations for the plurality of circuit boards and the boards when in the receiving stations defining passages with upper and lower openings between the boards for upward air flow through the passages, first groups of high temperature operating electronic components, and second groups of relatively low temperature operating components wherein the first groups of components are disposed within some passages and the second groups of components are disposed within others of the passages.

Embodiments of the invention will now be described, by way of example, with reference to the accompanying drawings, in which:

FIG. 1 is an isometric view of a circuit pack according to a first embodiment;

FIG. 2 is a cross-sectional view through the circuit pack of FIG. 1 and taken along line II—II in FIG. 1;

FIG. 2a is a view similar to FIG. 2 of part of the structure and a larger scale;

FIG. 3 is a view similar to FIG. 2 of a circuit pack according to a second embodiment;

Figure 4:
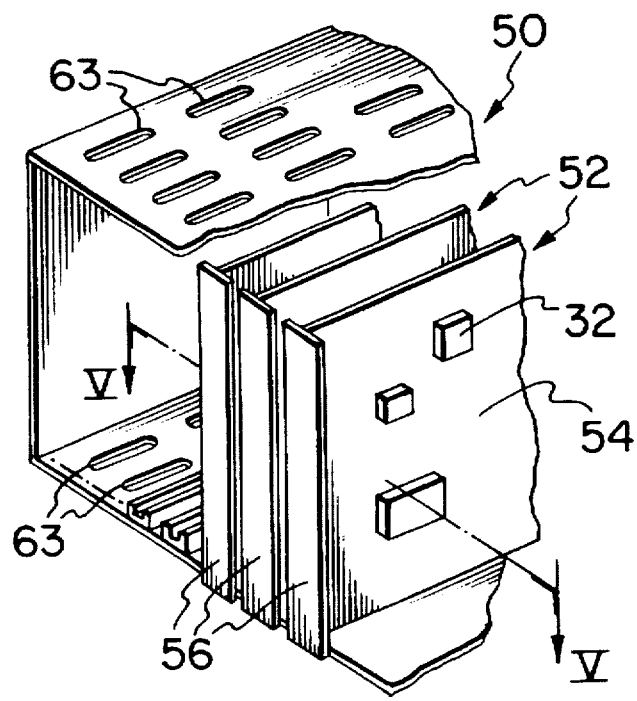
FIG. 4 is a diagrammatic isometric view of a shelf and circuit pack arrangement providing a third embodiment of the invention.

In a first embodiment as shown in FIGS. 1 and 2, a circuit pack 10 comprises a housing 12 having two substantially planar housing sides 14 and front and rear ends 16, side walls 14 and ends 16 surrounding and defining a rectangular chamber as shown particularly in FIG. 2. The walls 14 are formed with upwardly extending parallel fins 18 to provide the walls as heat sink structures. Within the enclosed chamber are provided two circuit boards 20 which extend between the two end walls 16 in parallel planes and with opposing surfaces 22 defining between them an upwardly extending passage 24. Opposite surfaces 26 of the two boards are spaced away from the side walls 14 to define further upwardly extending passages 28. The passages 24 and 28 are open at top and bottom of the structure, the openings being defined by apertures through EMI protective shields 30 disposed at upper and lower ends of the circuit pack. Only one such shield is shown in the structure, i.e. that at the top of the circuit pack in FIG. 1.

As shown in FIG. 2, electronic components are mounted on both sides of both of the boards 20. In greater detail, the electronic components 32 disposed on the opposing surfaces 22 of the boards are hot operating components whereas the electronic components 34 disposed on the other or opposite surfaces 26 of the boards are relatively low temperature operating electronic components. These low temperature operating components 34 are components which, while operating at low temperatures, may be susceptible to damage caused by overheating and it is desirable therefore to insulate, so far as is possible, the electronic components 34 from the heat produced by the components 32. In this respect, each of the circuit boards 20 provides heat insulation to retard the amount of heat transfer through the board from the components 32 to 34. Thus, the boards 20 provide a further function, in that not only do they support the components 32 and 34 and circuitry passing between the components, but they operate to insulate all of the low temperature operating components from the high temperature operating components.

In the structure of the first embodiment, the distances between the opposing surfaces 22 of the boards and between each of the surfaces 26 of the boards and the side walls 14 are predetermined to provide the required thermal drag over the two groups of components and for balancing the thermal drag taking into account the thermal isolation provided by the boards. As will be realized, the distances between the boards and between the boards and the side walls are parameters in the amount of air drag created as cooling air passes up through the passages 24 and 28. Hence, the greater the distance, the less the air drag. In the construction of FIG. 2, the greatest distance in this circuit pack arrangement is that between the surfaces 22 of the two boards. In effect therefore, the drag upon air conveyed through the passage 24 is minimized as much as possible for the purpose of removing most efficiently within the passage. On the other hand, with the circuit pack being of unitary width between the side walls 14, the distance across each air passage 28 is thus reduced to accommodate for the width of the passage 24. Thus, a greater air drag in the passage 28 will still allow air to pass through each of the passages 28 while removing sufficient heat from the components 34 together with any radiated heat into the side walls 14. In this construction, preferably the inside surfaces of the side walls 14 are coated with a material 35 (see FIG. 2a) which absorbs infrared radiation and thereby increases the degree of radiated heat removal from the electronic components 34.

It will be noted that in this embodiment, the hot operating components 34 are disposed within the widest passage 24 whereas the relatively low temperature operating components 32 are disposed in the narrowest passages 28. The width of the passages need not, however, be related to the locations of the high and low temperature operating components. The actual locations of the groups of hot operating components and the group of low temperature operating components depends upon the results which a structure is intended to achieve. Thus, while in this and other embodiments to be described, the high temperature operating components are shown as located within the widest passages, under certain design situations, this need not necessarily be the case. The essential feature of the invention and as relates to all embodiments is that the or each printed circuit boards acts in a thermally insulating capacity between the high temperature operating components on one side and the low temperature operating components on the other side of the board.

As shown by the first embodiment therefore with the construction of circuit pack according to the invention, the higher operating temperature electronic components are separated from the lower operating temperature components by the printed circuit boards which act as an insulating medium while the heat is conveyed away from both groups of components and while minimizing the effect of the heat generated by the higher operating components upon the lower operating components. With this arrangement and bearing in mind that the side walls may provide heat sinks for the structure, then it is a simple matter to determine the width of the passages 24 and 28 to achieve the desired temperature balancing effect for optimum heat removal.

In a second embodiment (FIG. 3) having similar advantages to the first embodiment, a circuit pack 40 differs from that of the first embodiment solely in the location of the electronic components and in the widths of the passages 24 and 28. With the construction shown in FIG. 3, the higher temperature operating components 32 are all placed upon the board surfaces 26, i.e. within the passages 28 whereas the lower temperature operating components 34 are disposed upon the surfaces 22 of the boards and within the passage 24. With this arrangement, the heat is removed from the higher temperature operating components 32 not only by natural or forced air convection through the passages, but also by the transfer of radiated heat from the components 32 into the side walls 14. With the arrangement of FIG. 3, undoubtedly the distances between the circuit boards 20 will need to be different from that in the first embodiment so as to remove the heat from these passages which is transferred into the passages at a different rate from in the first embodiment.

Figure 5:
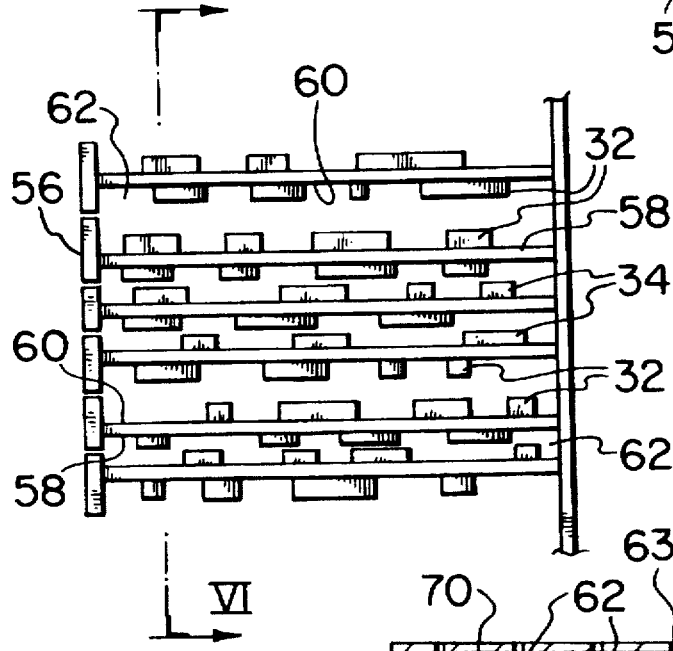
FIG. 5 is a cross-sectional view through part of the arrangement of FIG. 4 and taken along line V—V in FIG. 4.

The invention is not only concerned with circuit packs, for instance as described in the first and second embodiments, and which will, in use, be placed upon an electronic shelf. The invention also includes structures in which circuit packs having individual printed circuit boards which, when mounted in the shelves, are disposed at different distances apart, i.e. from one circuit pack to another. In a third embodiment as shown in FIGS. 4 and 5, a shelf 50 has receiving stations for a plurality of circuit packs 52 each of which has a single printed circuit board 54 and a front face plate 56. The face plates 56 have vertical edges which lie close together from face plate to face plate in the assembly of the packs within the shelf. Each of the printed circuit boards carries either or both high and low temperature operating components 32 and 34. In a case where a circuit board carries either the components 32 or the components 34 then these components are disposed upon one surface 58 or 60 of the board whereas when a board carries both groups of components then the low temperature components 32 are carried upon one surface, i.e. surface 58, and the high temperature operating components 34 are carried upon the other surface, i.e. the surface 60. As may be seen particularly from FIG. 5, the boards 60 when in their receiving stations define passages between them in which the components 32 and 34 are disposed. However, in each case, each of the passages 62 only contains either the low temperature operating components 32 or the high temperature operating components 34. It follows therefore that the board design must take into account the final positioning of the boards within the shelf with the object of having components 32 or 34 on either or one side of each board facing, respectively, components 32 or 34 on an adjacent board. Each passage 62 has upper and lower openings 63 provided in the shelf 50 for upward flow of air.

Figure 6:
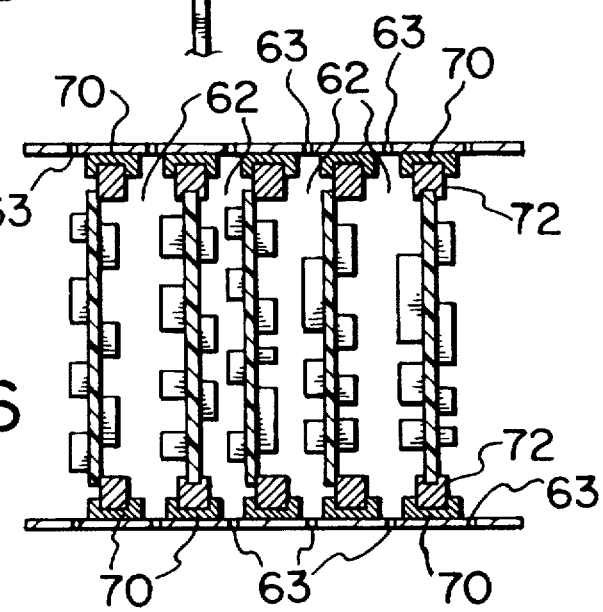
FIG. 6 is a diagrammatic front elevational cross-sectional view along line VI—VI in FIG. 5.

Thus with the structure of shelf and printed circuit boards or circuit packs, the passages 62 may be formed of different widths for the purpose of balancing thermal drag dependent upon which of the groups of components 32 and 34 are disposed in any particular case within a passage. In all instances, the printed circuit boards 52 provide a thermal insulation between the groups of electronic components 32 and 34 as discussed above in the first and second embodiments. As shown in FIG. 6, the distances across each of the passages 62 may be made different from one passage to another even through the receiving stations of the shelf are equally spaced apart in conventional manner from end to end of the shelf. As shown for instance in FIG. 6, the receiving stations are provided by guides 70 equally spaced apart. However, each of the boards 50 is supported upon an edge member 72 which, from board to board, is of different configuration in cross-section so that each respective board 60 may be disposed in a different position in a horizontal plane with regard to its guide 70 than that of another board or boards 60. Hence, as shown in FIG. 6, with the four boards illustrated therein, the two boards on the extreme ends of this group have shorter distances across the passages 62 than is the case between the two centrally positioned boards. With this arrangement, the two centrally positioned boards having the greater distance across the passage 62 would carry the higher temperature operating components 33 facing each other whereas the passages 62 at either side would contain the lower temperature operating components 34.

What is claimed is:

1. A circuit pack comprising two printed circuit boards within a housing, each Printed circuit board having a first surface and a second surface, the printed circuit boards being spaced apart with the first surfaces confronting each other and with the second surfaces facing and spaced from walls of the housing to provide air flow passages between the confronting first surfaces and between each second surface and a spaced wall of the housing, the passages having openings at each end of the housing, high temperature operating electronic components providing a first group of components, and relatively low temperature operating components comprising a second group of components with one of the groups of components being located on a first board surface and the other group of components being disposed on at least one second board surface, and wherein the passage between the confronting first surfaces and the passage between the at least one second board surface and its spaced wall of the housing are of different widths so as to balance thermal drag over the two groups of components.

2. A circuit pack according to claim 1 wherein the high temperature operational components are located in at least one passage between a board and its opposing housing wall and the low temperature operational components are located in the passage between the boards.

3. A circuit pack according to claim 1 wherein the low temperature operational components are located in the at least one passage between a board and its opposing housing wall and the high temperature operational components are located in the passage between the two boards.

4. A circuit pack according to claim 1 wherein the housing walls are provided upon their outer surfaces with heat exchange projections for transferring heat into ambient air on the outside of the housing.

5. A circuit pack according to claim 4 wherein the housing walls are coated on their inner surfaces with a material which absorbs infrared radiation.

6. A shelf and circuit pack arrangement comprising a shelf and a plurality of circuit packs, the shelf having receiving stations for the plurality of circuit packs and each of the circuit packs having at least one printed circuit board which is provided with a first surface and a second surface, the circuit packs when in the receiving stations locating the boards from circuit pack to circuit pack in confronting parallel relationship and defining passages between the boards from circuit pack to circuit pack with upper and lower openings provided to the passages for upward flow of air, the arrangement also comprising first groups of high temperature operating electronic components located on first surfaces of boards and second groups of relatively low temperature operating electronic components located on second surfaces of boards and wherein the first groups of components are all disposed within some passages and the second groups of components are all disposed within others of the passages, the circuit boards providing thermal insulation between electronic components of first groups on the first surfaces of boards and electronic components of second groups on second surfaces of boards, and the distances between the boards being predetermined so that the first groups of high temperature operating components are disposed within relatively wide passages for heat removal purposes and the second groups of relatively low temperature operating components are disposed in narrower passages.

7. An arrangement according to claim 6 wherein the receiving stations are provided by a plurality of upper and lower guides with each of the guides having a corresponding lower guide to provide a single receiving station and wherein the guides are equally spaced apart along the shelf, and wherein the boards have edge guide members for sliding relationship with the shelf guides and the guide members of some boards are of different configuration from those of other boards so as to locate the boards in certain positional relationships whereby the distances across some of the passages are less than those across others of the passages.

8. A circuit pack according to claim 2 wherein the at least one passage between a board and its opposing housing wall is wider than the passage between the boards.

9. A circuit pack according to claim 3 wherein the passage between the boards is wider than the at least one passage between a board and its opposing housing wall.

* * * * *